United States Patent [19]

Ishihara et al.

[11] Patent Number: 5,032,694
[45] Date of Patent: Jul. 16, 1991

[54] CONDUCTIVE FILM CIRCUIT AND METHOD OF MANUFACTURING THE SAME

[75] Inventors: Satoshi Ishihara, Ageo; Takeo Sugishita, Yono, both of Japan

[73] Assignees: Mitsui Mining & Smelting Co., Ltd., Chuo; Mitsutoyo Corporation, Minato, both of Japan

[21] Appl. No.: 397,452
[22] PCT Filed: Dec. 15, 1988
[86] PCT No.: PCT/JP88/01275
§ 371 Date: Aug. 4, 1989
§ 102(e) Date: Aug. 4, 1989
[87] PCT Pub. No.: WO89/06086
PCT Pub. Date: Jun. 29, 1989

[30] Foreign Application Priority Data

Dec. 18, 1987 [JP] Japan ................................ 62-318736
Mar. 8, 1988 [JP] Japan .................................. 63-52595

[51] Int. Cl.$^5$ .............................................. H05K 1/00
[52] U.S. Cl. ................................... 174/256; 174/257; 174/259; 174/264
[58] Field of Search ............... 174/256, 257, 261, 264, 174/259

[56] References Cited

U.S. PATENT DOCUMENTS

| | | | |
|---|---|---|---|
| 3,621,442 | 11/1971 | Racht | 174/256 X |
| 4,019,168 | 4/1977 | Collins | 338/327 X |
| 4,226,932 | 10/1980 | Ferraris | 174/256 X |
| 4,539,434 | 9/1985 | Krause | 174/261 X |
| 4,594,473 | 6/1986 | Inoue et al. | 174/257 |
| 4,628,149 | 12/1986 | Dohya | 174/257 |

FOREIGN PATENT DOCUMENTS

| | | |
|---|---|---|
| 131158 | 11/1977 | Japan . |
| 162254 | 12/1980 | Japan . |
| 166949 | 12/1980 | Japan . |
| 35364 | 2/1982 | Japan . |
| 48993 | 3/1986 | Japan . |

Primary Examiner—Morris H. Nimmo
Attorney, Agent, or Firm—Bucknam and Archer

[57] ABSTRACT

A tantalum thin film circuit which is formed on an insulator or semiconductor substrate through an adhesive layer, a part or the entire surface of said tantalum thin film circuit being coated with a metal selected from among palladium, gold, platinum and rhodium or an alloy thereof. In addition, a conductive film circuit is formed on the thus formed tantalum thin film circuit by forming an interlayer insulating film having an adhesive layer on each of the upper and lower sides thereof, and forming a circuit using a metal selected from among tantalum, palladium, gold, platinum and rhodium or an alloy thereof.

2 Claims, 5 Drawing Sheets

CONDUCTIVE FILM CIRCUIT AND METHOD OF MANUFACTURING THE SAME

TECHNICAL FIELD

The present invention relates to a conductive film circuit formed on an insulator substrate or a semiconductor substrate. More particularly, the present invention relates to a conductive film circuit which has resistance to electric corrosion and a lowered as well as stabilized surface resistance and which is produced by a simplified manufacturing process and also to a method of manufacturing the same.

BACKGROUND ART

Metallic materials which are used to form a circuit pattern on an insulator substrate or a semiconductor substrate are required to have the following properties: (1) Metallic materials used for the above-described purpose must be superior in corrosion resistance; (2) a metal which is used to form a pattern must have excellent adhesion to the surface of an insulator or semiconductor substrate; (3) metallic materials used must have an electrical conductivity which is substantially equal to or higher than that of conventional conducting materials; (4) the difference in thermal expansion coefficient between a substrate and a metal used must be small so that the metal is unlikely to peel off in a repeated cycle in which it is alternately subjected to high and low temperatures; and so forth.

As shown in FIG. 10, a metal 1b such as aluminum, copper, nickel or chromium has heretofore been employed as a metal used to form a circuit pattern on an insulator or semiconductor substrate 6.

However, when such a metal is employed as a wiring material, if portions of a circuit which have different potentials are shorted through water, dissolution of the higher-potential portion is unavoidable.

When in contact with water containing corrosive chemical species such as chlorine ions, sulfate ions, nitrate ions, ferric ions, etc., the electrode is, in many cases, dissolved.

To avoid the above-described problem of corrosion, it is conventional practice to coat the surface of a conductive film circuit with a protective film 7 for prevention of corrosion which is made of a glass, ceramic or plastic material to thereby prevent intrusion of water into the conducting portion of the circuit pattern, as shown in FIG. 10.

The conventional practice suffers, however, from the disadvantage that, even if the thickness of the coating film is increased (e.g., 50 μm or more in the case of a resin material) in order to eliminate water permeability and defects such as pinholes from the coating film formed as described above, water penetration cannot be made zero.

In order to overcome these disadvantages of the prior art, the present inventors proposed an invention of forming a circuit pattern using a corrosion-resistant metal such as tantalum, titanium or niobium.

However, even in this case there has been the problem that oxidation of the surface of a thin film circuit made of a metal such as tantalum causes an increase in the surface resistance and hence a rise in the contact resistance with an external circuit. In addition, when a multilayer thin film circuit is formed, the resistance at a via hole may be increased.

In view of the above-described problems of the prior art, it is an object of the present invention to provide a conductive film circuit having high corrosion resistance and high reliability which is capable of normally performing semipermanently even if it is used in an environment that includes water content without coating the surface of the circuit and the electrode surface with an inorganic or organic protective film for prevention of corrosion and which is not subject to rise in the resistance at a terminal portion or in the resistance at a via hole which would otherwise occur due to oxidation of the surface of the conductive film circuit and the electrode surface and which has no problem of separation even if it is subjected to a temperature cycle over a wide temperature range.

SUMMARY OF INVENTION

The present inventors conducted exhaustive studies in order to attain the above-described object and, as a result, have found that it is possible to obtained a conductive film circuit which has considerably superior corrosion resistance and surface oxidation resistance as well as high reliability in comparison with the prior art by providing an adhesive layer on a substrate, employing a tantalum thin film as a conductive film, and coating a part or the entire surface of the tantalum thin film circuit at least a portion which needs to lower the surface resistance with a metal selected from the group consisting of palladium, gold, platinum and rhodium or an alloy thereof. The present invention has been accomplished on the basis of this finding.

More specifically, the present invention provides a tantalum thin film circuit which is formed on either an insulator or semiconductor substrate through an adhesive layer, a part or the entire surface of the tantalum thin film circuit being coated with a metal selected from the group consisting of palladium, gold, platinum, rhodium and an alloy thereof.

Examples of insulator substrates which are usable in the present invention are ceramic substrates such as glass, alumina and aluminum nitride substrates and flexible resin substrates such as polyimide, epoxy resin, polyester and polybutadiene substrates. Examples of semiconductor substrates usable in the present invention are simple substance substrates such as silicon and germanium substrates and compound semiconductor substrates such as indium-antimony (In-Sb) and gallium-arsenic (Ga-As) substrates. In addition, the present invention is applicable to extrinsic semiconductors, metallic oxide semiconductors such as $Fe_2O_3$, $CuO$, $ZnO$, $SnO_2$ and $BaTiO_3$ and dielectrics such as $LiNbO_3$ and $PbTiO_3$.

According to the present invention, a thin film of tantalum, which has excellent corrosion resistance, is employed as a conductive film to form a pattern and a part or the entire surface of the tantalum thin film circuit is coated with a metal selected from the group consisting of palladium, gold, platinum, rhodium and an alloy thereof (hereinafter referred to as simply "a noble metal such as palladium"), as described above.

A thin film of a noble metal such as palladium may be coated only on a lead connecting portion, a terminal portion or a via hole contact portion of the tantalum thin film circuit.

Coating thus provided on the surface of the tantalum thin film circuit enables a lowering in the surface resistance and it is therefore possible to connect the terminal portion and an external circuit directly to each other.

In regard to the via hole portion of a multilayer thin film circuit formed according to the present invention also, it is possible to lower the contact resistance at the via hole without the need for a special treatment such as sputter etching.

As a method of forming a circuit pattern on an insulator or semiconductor substrate, it is possible to employ vacuum deposition, CVD, paste coating or other similar methods in addition to known sputtering method.

BRIEF DESCRIPTION OF THE DRAWINGS

FIGS. 1-10, drawings:

1a is a tantalum film, 1b is a conductive film of a metal such as aluminum, copper, nickel, chromium, etc., 2 is a conductive film of a metal selected from the group consisting of palladium, gold, platinum and rhodium or an alloy thereof, 3 is an insulating film, 4 is an adhesive layer film, 5a is a tantalum electrode, 5b is an electrode made of a metal selected from the group consisting of palladium, gold, platinum and rhodium or an alloy thereof, 5c is an electrode made of a metal such as aluminum, copper, nickel, chromium, etc., 6 is substrate, 7 is surface protective film (glass, ceramics or plastics), 8 is a resist, and 9 is a terminal portion respectively.

DETAILED DESCRIPTION OF THE INVENTION

The present invention will be described hereinunder in more detail with reference to the drawings.

Figure 1:
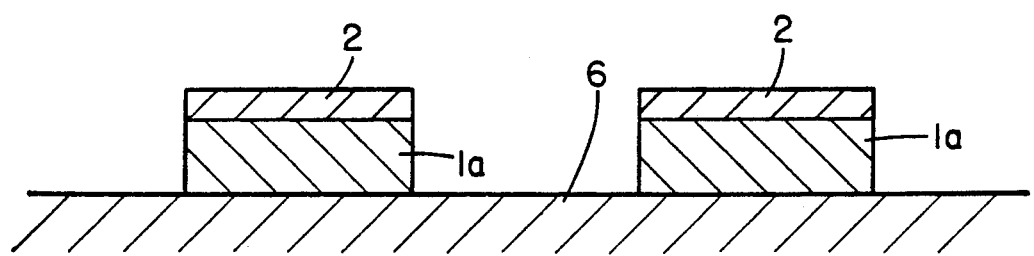
FIG. 1 to 7 are sectional view each showing one example of the structure of the tantalum thin film circuit according to the present invention.

FIG. 1 shows a tantalum thin film circuit in which a noble metal 2 such as palladium is coated on the surface of a tantalum conductive circuit 1a formed on an insulator or semiconductor substrate 6.

Figure 2:
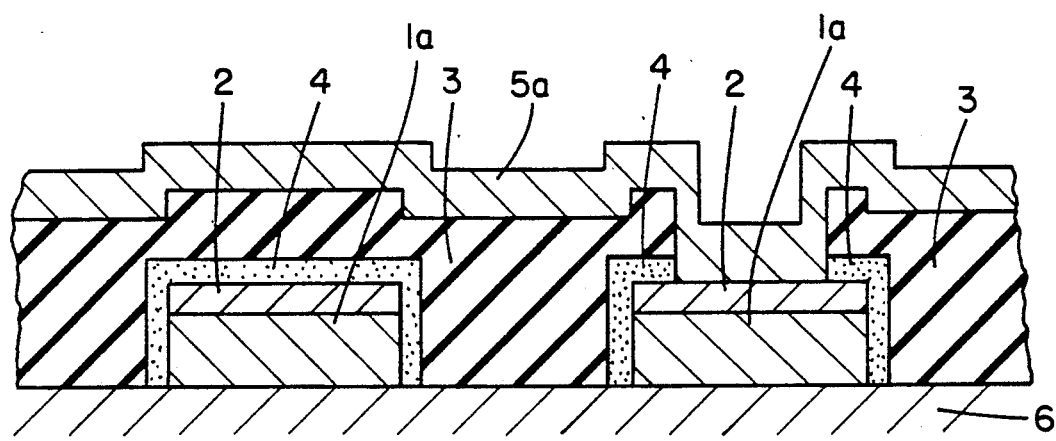

FIG. 2 shows a structure which is obtained in such a manner that, after an adhesive layer 4 and an insulating film 3 such as $SiO_2$ film or a polyimide film have been successively formed on the structure shown in FIG. 1, a via hole portion is etched to remove the adhesive layer 4 and the insulating film 3 therefrom, and a tantalum electrode 5a is then formed thereon. It is possible to employ another manufacturing process wherein the insulating film pattern 3 and the adhesive layer 4 are formed by the lift-off method and then the tantalum electrode 5a is formed thereon.

Figure 3:
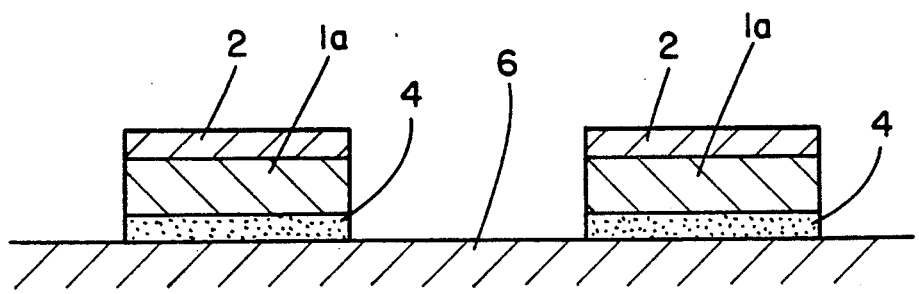

FIG. 3 shows a conductive film circuit structure wherein, in the case where the adhesion between the substrate 6 and the tantalum film circuit 1a is unsatisfactory, for example, tantalum oxide ($Ta_2O_5$) is interposed between the tantalum film circuit 1a and the substrate 6 as being an adhesive layer film 4.

Figure 4:
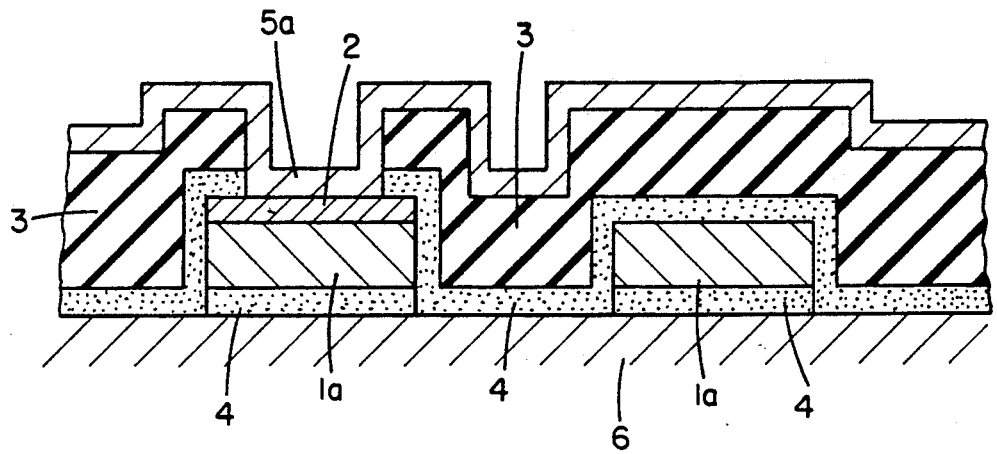

FIG. 4 shows another structure wherein, in the case where the adhesion between the substrate 6 and the tantalum film circuit 1a or between the tantalum film circuit 1a and the insulating film 3 is unsatisfactory, for example, $Ta_2O_5$ is interposed therebetween to form a conductive film circuit structure in the same way as in the case of the structure shown in FIG. 3 and, after an adhesive layer 4 and an insulating film 3 have been successively formed, the insulating film 3 and the adhesive layer film 4 which are in the central portion of the circuit pattern coated with a noble metal 2 such as palladium are removed by etching and a tantalum electrode 5a is formed thereon. In this case also, the pattern may be formed by utilization of the lift-off method.

Figure 10:
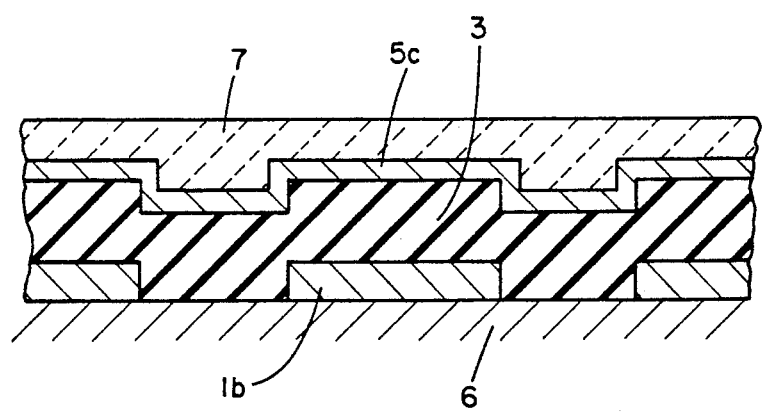
FIG. 10 is a sectional view showing the structure of a conductive film circuit according to the prior art. In the drawings.

Thus, according to the present invention, a tantalum thin film 1a is employed as a conductive film and the upper side of this thin film pattern is coated with a noble metal 2 such as palladium. Therefore, unlike the conductive film 1b of a metal such as aluminum, copper, nickel, chromium, etc. which is used in the prior art shown in FIG. 10, the film 1a has considerably excellent corrosion resistance and it is therefore unnecessary to employ a protective film 7 for prevention of corrosion which is made of glass, ceramics or plastics, such as that shown in FIG. 10.

Accordingly, the present invention is free from the problems of the prior art, such as water permeability and the pinholes of the coating film and is also free from the problem that oxidation of the surface of the metal thin film circuit causes an increase in the surface resistance and hence a rise in the contact resistance with an external circuit. Thus, the reliability of the circuit is considerably enhanced in comparison with the prior art.

As another embodiment form of the present invention, a noble metal such as palladium may be employed to form a conductive film.

Figure 5:
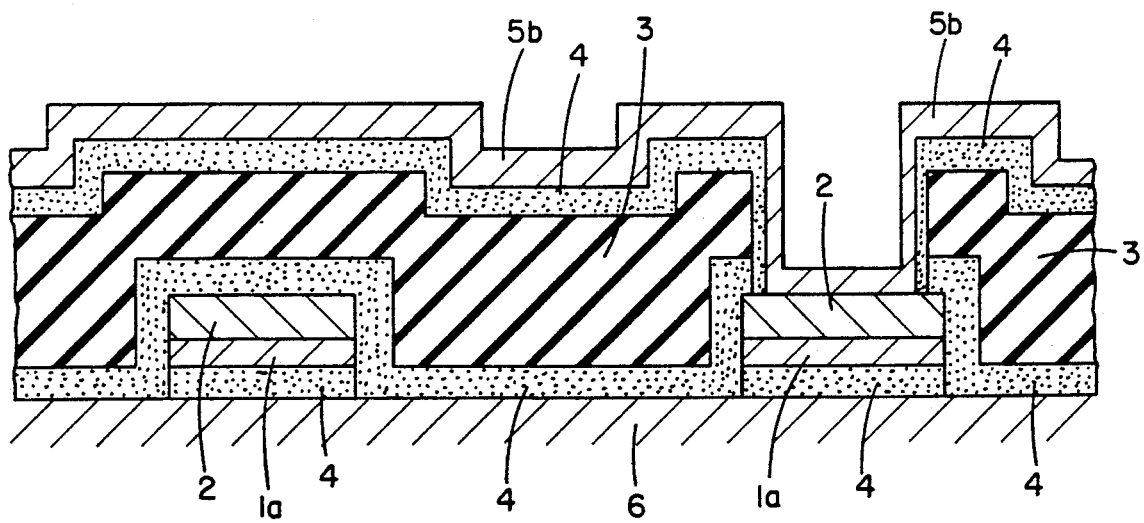

More specifically, as shown in FIG. 5, after an adhesive layer 4 of tantalum oxide or the like and a tantalum thin film layer have been successively formed on an insulator or semiconductor substrate, a conductive film circuit 2 is formed on the tantalum thin film layer using a metal selected from the group consisting of palladium, gold, platinum and rhodium or an alloy thereof and then an interlayer insulating film 3 and a conductive film circuit 5b are successively formed thereon, the circuit 5b being made of a metal selected from the group consisting of palladium, gold, platinum and rhodium or an alloy thereof. In this case, adhesive layers 4 may be provided at both upper and lower sides, respectively, of the interlayer insulating film 3 to further increase the peel strength.

By providing an adhesive layer and employing a metal selected from the group consisting of palladium, gold, platinum, rhodium or any alloy thereof to form a conductive film on the adhesive layer, as described above, it is possible to further enhance the oxidation resistance, lower the resistance and increase the peel strength.

A preferable method of manufacturing a tantalum thin film circuit according to the present invention will next be explained.

The method of manufacturing a tantalum thin film circuit according to the present invention comprises employing a thin film of a metal selected from the group consisting of palladium, gold, platinum rhodium and an alloy thereof as an etching mask material which is used when a tantalum thin film circuit is formed by etching, and leaving, after the etching process, the thin film of a metal selected from the group consisting of palladium, gold, platinum and an alloy thereof on a part of the entire surface of the tantalum thin film circuit to thereby coat a part or the whole of the circuit surface with the thin film.

Although it is general practice to employ a chromium film as an etching mask when a tantalum thin film which is formed on an insulator or semiconductor substrate is etched with an etching liquid, a palladium thin film is employed in place of the chromium thin film. After the palladium thin film has been patterned, the tantalum thin film is subsequently etched with the patterned palladium used as a mask, thereby forming a tantalum thin film circuit pattern. In this case, since a palladium thin film is employed, the mask material, which is usually removed, can be left according to need. This is because a chromium thin film causes electric corrosion in case of high temperature and humidity, while a palladium thin film has resistance to electric corrosion high temperature and humidity. It is a manner of course that the palladium thin film left acts so as to lower the surface resistance and permits direct connection with an external circuit as well as enables a lowering in the contact resistance at a via hole.

In addition to a palladium thin film according to the present invention, a thin film of gold, platinum, rhodium or the like may be selected as a tantalum etching mask in place of a chromium thin film conventionally employed as a tantalum etching mask. Further, the thin film of gold, platinum, rhodium or the like may be left in the same way as in the case of palladium to provide a circuit having a lowered surface resistance.

By way of example, the method of manufacturing a tantalum thin film according to the present invention will next be explained with reference to FIG. 8. A thin film 1a of tantalum having a predetermined thickness is formed on an insulator or semiconductor substrate 6, and a palladium thin film 2 having a predetermined thickness is formed thereon. Thereafter, a resist resin 8 is coated thereon to form a resist pattern (a). Next, the palladium is etched and, subsequently, the tantalum film is etched by using the palladium film as a mask and the resist 8 is removed to form a tantalum thin film circuit coated with the palladium film 2(b).

Next, a resists film 8 is further formed on the tantalum thin film circuit thus formed and then an adhesive layer 4 is formed (c). Further, an interlayer insulating film 3 is formed (d) and then the resist film 8, the adhesive layer 4 and the insulating film 3 which are formed on the tantalum circuit are removed by the lift-off method to form a via hole (e). Further, a conductive film circuit is formed to produce a multilayer tantalum thin film circuit (f).

As another manufacturing method, it is also possible to coat palladium, gold, platinum or the like on a necessary portion after the formation of a tantalum thin film circuit. In such a case, it is necessary to carry out soft etching before the coating process so as to lower the resistance at the surface of tantalum. As a soft etching process, a wet etching process may be employed and it is also possible to employ a dry process such as sputter etching.

Figure 9:
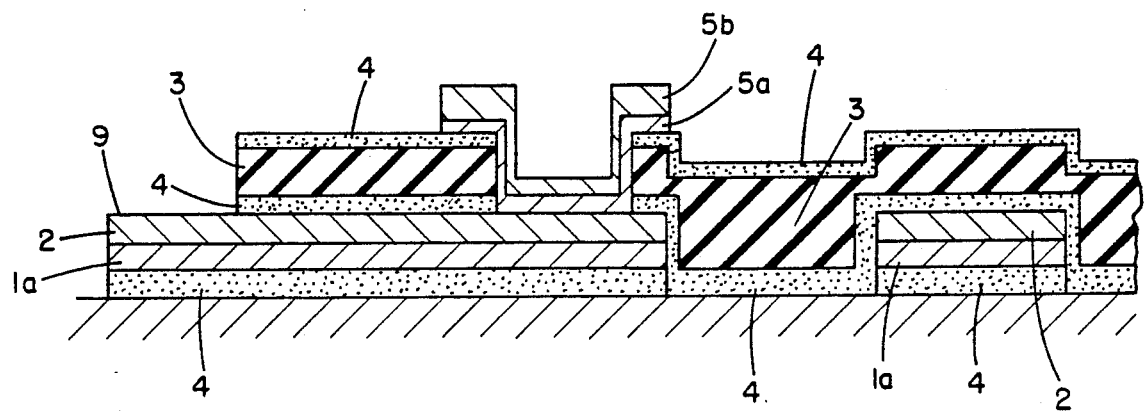
FIG. 9 is a sectional view showing one example of a conductive film circuit produced by use of the manufacturing method according to the present invention.

FIG. 9 shows one example of a conductive film circuit produced by the manufacturing method according to the present invention.

EXAMPLES AND COMPARATIVE EXAMPLES

The present invention will be explained below more specifically by way of Examples and comparative Examples.

EXAMPLE 1

On a soda lime glass substrate (100×100×1.5 mm) were successively formed by sputtering a tantalum oxide adhesive layer (200 Å), a tantalum film (2000 Å) and a gold film (500 Å) according to the structure shown in FIG. 3. A resist resin pattern was formed thereon and the gold film was first etched with an etching liquid. With the gold pattern used as a mask, the tantalum film and the tantalum oxide insulating film were etched.

Thereafter, the gold film was left on necessary portions to form a thin film circuit pattern. It should be noted that, before the sputtering of gold, the surface of the tantalum film was subjected to sputter etching to lower the interfacial resistance.

EXAMPLE 2

On a soda lime glass substrate (100×100×1.5 mm) were successively formed by sputtering a tantalum oxide adhesive layer (200 Å), a tantalum film (300 Å) and a palladium film (1000 Å) according to the structure shown in FIG. 4. The palladium film was etched using a resist pattern and, subsequently, the tantalum film and the tantalum oxide film were etched with the palladium film used as a mask, Next, an interlayer insulating film having a via hole was formed by the lift-off method. Before the formation of the $SiO_2$ film a tantalum oxide film having a thickness of (200 Å) was formed as being an adhesive layer. Further, a tantalum thin film pattern was formed on the interlayer insulating film, thereby producing a multilayer thin film circuit.

EXAMPLE 3

A multilayer thin film circuit was formed in the same way as in Example 2 except that polyimide (2 $\mu$m) was employed as an interlayer insulating film such as that shown in FIG. 4.

The tantalum thin film circuits of Examples 1 to 3, each having a pattern formed as described above, were subjected to such a test that a potential difference of 2.5 V was produced between electrodes which were not shorted in an environment of 50° C. and a relative humidity of 90%. Even after the test had been conducted for 1000 hours, no corrosion was found in the conductor film and the adhesive layer film and each circuit operated normally without the need to coat the surface.

Even when each circuit was alternately held at −50° C. and 120° C. for 30 minutes each and thus repeatedly subjected to 30 cycles of heating and cooling, no separation occurred and it was therefore confirmed that tantalum had excellent adhesion to the glass substrate.

When a flexible wiring board was connected through a connector to a terminal having a width of 1 mm in which the surface of a tantalum film was not coated with a noble metal or the like but exposed, the contact resistance was 1 kΩ or more, whereas, when a flexible wiring board was connected through the same connector to each of the above-described circuits in which the tantalum surface at a terminal portion was coated with gold or palladium, the contact resistance was so low that it was ignorable.

Further, in regard to the contact resistance at a via hole, a via hole which was 100 by 100 microns square and had not coating showed a contact resistance of 100Ω or more, whereas, a via hole of the same size which was coated with palladium showed a contact resistance which was closed to zero.

EXAMPLE 4

On a blue flat glass substrate (100×100×1.5 mm) were successively formed by sputtering a tantalum oxide adhesive layer (200 Å), a tantalum film (200 Å)

and a palladium film (2000 Å), as being a conductive film according to the structure shown in FIG. 5. The palladium film was etched using a resist pattern, thereby patterning the palladium film.

Subsequently, the tantalum oxide film and the tantalum thin film were etched with the patterned palladium film used as a mask. Next, an interlayer insulating film having a via hole was formed by the lift-off method. Before and after the formation of the SiO$_2$ film, a tantalum oxide film have a thickness of 200 Å was formed as being an adhesive layer. Further, a conductor pattern was formed using palladium to thereby produce a multilayer thin film circuit.

The conductive film circuit having a pattern formed as described above was subjected to such a test that a potential difference of 2.5 V was produced between electrodes which were not shorted in an environment of 50° C. and a relative humidity of 90%. Even after the test have been conducted for 100 hours, no corrosion was found in the conductor film and the adhesive layer film and the circuit operated normally without the need to coat the surface.

Even when the circuit was alternately held at −50° C. and 120° C. for 30 minutes each and thus repeatedly subjected to 30 cycles of heating and cooling, no separation occurred and it was therefore confirmed that the adhesive layer had excellent adhesion to the glass substrate, the palladium film and the interlayer insulating film.

COMPARATIVE EXAMPLE 1 AND EXAMPLES 5 and 6

Figure 6A:
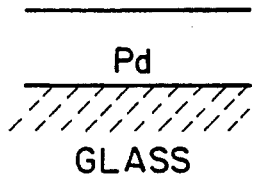
Figure 6B:
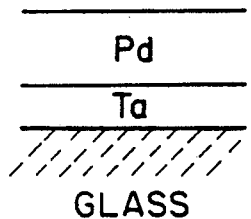
Figure 6C:
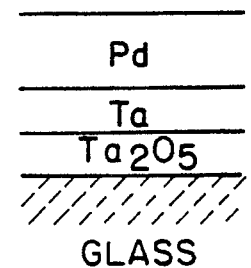

As shown in FIG. 6(b) and 6(c), a palladium film having a thickness of 2000 Å, a tantalum oxide film having a thickness of 200 Å and a tantalum film having a thickness of 200 Å were selectively formed on a soda lime glass substrate by sputtering to prepare peel strength test samples.

The palladium films thus formed were subjected to a peel strength test. The results are shown in Table 1.

TABLE 1

| | Peel strength (g/cm$^2$) | Remarks |
| --- | --- | --- |
| Comparative Example 1 | less than 450 | FIG. 6 (a) |
| Example 5 | 700 or more | FIG. 6 (b) |
| Example 6 | 700 or more | FIG. 6 (c) |

It will be clear from the results of the peel strength test that the peel strength was increased by a large margin by providing an adhesive layer of tantalum or tantalum and tantalum oxide between the glass substrate and the palladium film.

COMPARATIVE EXAMPLE 2 AND EXAMPLE 7

Figure 7A:
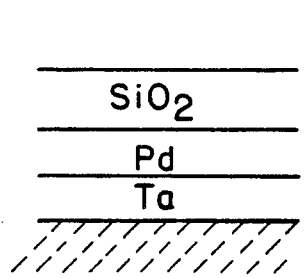
Figure 7B:
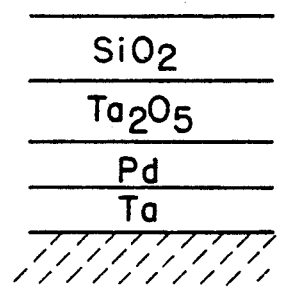
Figure 8A:
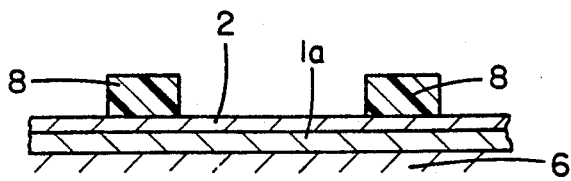
FIG. 8 shows one example of the method of manufacturing a tantalum film circuit.
Figure 8B:
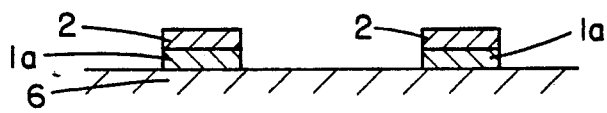
Figure 8C:
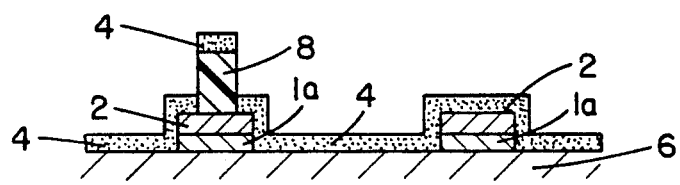
Figure 8D:
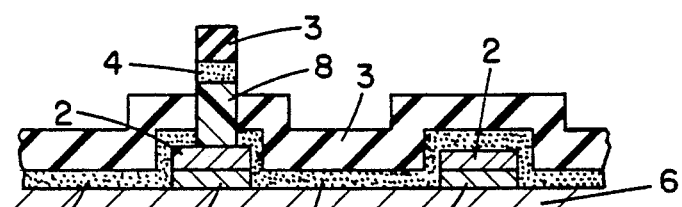
Figure 8E:
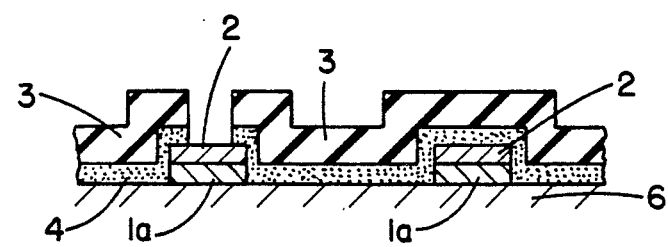
Figure 8F:
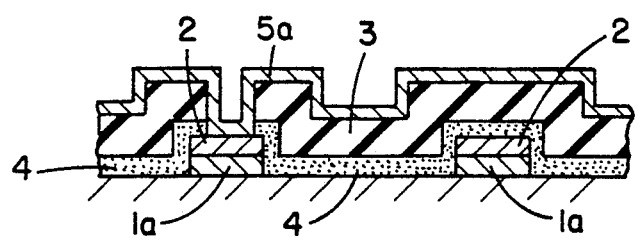

As shown in FIGS. 7(a) and 7(b), after a tantalum thin film had been formed on a soda lime glass substrate, a palladium film having a thickness of 2000 Å was formed thereon and, in the case of FIG. 7(a), a silicon oxide film having a thickness of 2000 Å was deposited thereon by sputtering, whereas, in the case of FIG. 7(b), an adhesive layer of tantalum oxide having a thickness of 200 Å and a silicon oxide film having a thickness of 2000 Å were deposited thereon by sputtering, thereby preparing peel strength test samples.

The silicon oxide films thus formed were subjected to a peel strength test. The results are shown in Table 2.

TABLE 2

| | Peel strength (g/cm$^2$) | Remarks |
| --- | --- | --- |
| Comparative Example 2 | less than 450 | FIG. 7 (a) |

TABLE 2-continued

| | Peel strength (g/cm$^2$) | Remarks |
| --- | --- | --- |
| Example 7 | 700 or more | FIG. 7 (b) |

It will be clear from the results of the peel strength test that the peel strength was increased by a large margin by providing an adhesive layer of tantalum oxide between the palladium film and the silicon oxide film (insulating film).

As has been described above, the tantalum thin film circuit according to the present invention has the following advantageous effects:

(1) In addition to the advantageous effect obtained by employment of tantalum, there is such an advantageous effect that, since the circuit is coated with a noble metal such as palladium, even if electrode portions which have different potentials are shorted through water during a circuit operation, there is no fear of the higher-potential portion being dissolved.

(2) Even if an electrode obtained according to the present invention is repeatedly subjected to heating and cooling in a wide temperature range of from −50° C. to 120° C., peeling off the film will not occur.

(3) Provision of an adhesive layer between a substrate and a conductive film or between an insulating film and an electrode enables an increase in the peel strength of the conductive film or the electrode.

(4) It is possible to lower the resistance at a terminal portion or at a through-hole portion.

(5) Further, the manufacturing method of the present invention enables the manufacturing process to be shortened by effective utilization of a thin film of a noble metal such as palladium or an alloy thereof which is used as a mask for etching a tantalum thin film.

INDUSTRIAL APPLICABILITY

Thus, the tantalum thin film circuit obtained according to the present invention is capable of normally operating semipermanently without the need to coat the circuit surface. Accordingly, it is possible to provide a circuit which has considerably high reliability.

What is claimed is:

1. A circuit assembly having a conductive pattern, said assembly consisting of an insulating or semiconducting substrate (6), a tantalum conductive film (1a) formed on said insulating or substrate, a coating (2) of a metal selected from the group consisting of palladium, gold, platinum, rhodium and an alloy thereof on at least a portion of said tantalum film, an adhesive layer (4) consisting of a tantalum oxide film formed on said coating and a portion of said insulating or semiconducting substrate, said adhesive layer having a via hole to complete the circuit with an electrode (5a; 5b) placed above said adhesive layer forming part of the conductive pattern.

2. A circuit assembly having a conductive pattern, said assembly being prepared by forming a thin tantalum conductive film (1a) on an insulating or semiconducting substrate (6), through a first adhesive layer consisting of a tantalum oxide thin film (4), coating a part or the entire surface of said tantalum thin film (1a) with a metal selected from the group consisting of palladium, gold, platinum, rhodium and an alloy thereof (2), forming a second adhesive layer consisting of tantalum oxide on said coating and at least a portion of said substrate, placing an insulating film (3) over said second adhesive layer and a portion of said insulating or semiconducting substrate, forming a via hole in said insulating film and in said second adhesive layer, placing an electrode (5a; 5b) above said insulating film forming part of the conductive pattern.

* * * * *